United States Patent
Hofer et al.

(10) Patent No.: US 11,579,202 B2
(45) Date of Patent: Feb. 14, 2023

(54) ELECTRIC CURRENT MEASURING ARRANGEMENT AND BATTERY SYSTEM

(71) Applicant: SAMSUNG SDI CO., LTD., Yongin-si (KR)

(72) Inventors: Maximilian Hofer, Hartberg (AT); Renato Mandic, Graz (AT); Thomas Trathnigg, Graz (AT); Jürgen Fritz, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 63 days.

(21) Appl. No.: 17/342,936

(22) Filed: Jun. 9, 2021

(65) Prior Publication Data

US 2021/0382116 A1    Dec. 9, 2021

(30) Foreign Application Priority Data

Jun. 9, 2020    (EP) .................................... 20178960
Jun. 8, 2021    (KR) ........................ 10-2021-0074161

(51) Int. Cl.
*G01R 31/367*    (2019.01)
*B60R 16/04*    (2006.01)
*G01R 31/382*    (2019.01)

(52) U.S. Cl.
CPC ............ *G01R 31/367* (2019.01); *B60R 16/04* (2013.01); *G01R 31/382* (2019.01)

(58) Field of Classification Search
CPC .... G01R 31/367; G01R 31/382; B60R 16/04; H01M 10/425; H02J 9/065; Y02B 20/30

(Continued)

(56) References Cited

U.S. PATENT DOCUMENTS

2008/0094034 A1    4/2008    Takahashi et al.
2016/0336623 A1    11/2016    Nayar et al.

(Continued)

FOREIGN PATENT DOCUMENTS

EP    0388523 A2    9/1990

OTHER PUBLICATIONS

European Application No. 20178960.9 Extended Search Report, dated Dec. 2, 2020.

*Primary Examiner* — Melissa J Koval
*Assistant Examiner* — Trung Q Nguyen
(74) *Attorney, Agent, or Firm* — Lee IP Law, P.C.

(57) ABSTRACT

An electric current measuring arrangement includes: a first control unit including a first microcontroller; a second control unit including: a second microcontroller; an amplifier electrically interconnected between the second microcontroller and terminals of a shunt resistor for current measurement; and a node interconnected between one of the terminals of the shunt resistor and the amplifier; a communication line communicatively connecting the first control unit and the second control unit. The first microcontroller is configured to generate a test pattern signal, and to transmit the test pattern signal to the second control unit through the communication line, the second control unit is configured to transmit the test pattern signal to the node, the second microcontroller is configured to receive a measuring signal through the amplifier, and the first microcontroller is configured to receive the measuring signal, compare the measuring signal with the test pattern signal, and verify the current measurement.

13 Claims, 3 Drawing Sheets

(58) Field of Classification Search
USPC ............. 324/415–417, 425–437, 76.11, 600, 324/123 R, 500, 515–523
See application file for complete search history.

(56) References Cited

U.S. PATENT DOCUMENTS

| | | |
|---|---|---|
| 2017/0328940 A1 | 11/2017 | Choi |
| 2018/0123357 A1 | 5/2018 | Beaston et al. |
| 2018/0188326 A1 | 7/2018 | Huh et al. |
| 2019/0004094 A1* | 1/2019 | Park .................. G01R 15/14 |
| 2019/0326742 A1* | 10/2019 | Jyumonji ................ H02H 1/04 |

* cited by examiner

ELECTRIC CURRENT MEASURING ARRANGEMENT AND BATTERY SYSTEM

CROSS-REFERENCE TO RELATED APPLICATION

European Patent Application No. 20178960.9, filed on Jun. 9, 2020, in the European Intellectual Property Office, and entitled: "Electric Current Measuring Arrangement and Battery System," and Korean Patent Application No. 10-2021-0074161, filed on Jun. 8, 2021, are incorporated by reference herein in their entirety.

BACKGROUND

1. Field

Embodiments relate to an electric current measuring arrangement for a battery system and a method of measuring electric current of a battery system. Embodiments also relate to a corresponding battery system and an electric vehicle.

2. Description of the Related Art

In the recent years, vehicles for transportation of goods and people have been developed using electric power as a source for motion. Such an electric vehicle may be an automobile that is propelled by an electric motor, using energy stored in rechargeable batteries. An electric vehicle may be solely powered by batteries or may be a form of hybrid vehicle powered by, e.g., a gasoline generator. Furthermore, the vehicle may include a combination of electric motor and combustion engine. In general, an electric-vehicle battery (EVB) or traction battery is a battery used to power the propulsion of battery electric vehicles (BEVs). Electric-vehicle batteries may differ from starting, lighting, and ignition batteries by being designed to give power over sustained periods of time. A rechargeable or secondary battery differs from a primary battery in that it can be repeatedly charged and discharged, while the latter provides only an irreversible conversion of chemical to electrical energy. Low-capacity rechargeable batteries may be used to supply power for small electronic devices, such as cellular phones, notebook computers and camcorders, while high-capacity rechargeable batteries may be used to supply power for hybrid vehicles and the like.

In general, rechargeable batteries include an electrode arrangement including a positive electrode, a negative electrode, and a separator interposed between the positive and negative electrodes, a case receiving the electrode arrangement, and an electrode terminal electrically connected to the electrode arrangement. An electrolyte solution is injected into the case in order to enable charging and discharging of the battery via an electrochemical reaction of the positive electrode, the negative electrode, and the electrolyte solution. The shape of the case, e.g., cylindrical or rectangular, depends on the battery's intended purpose. Lithium-ion (and similar lithium polymer) batteries, widely used in laptops and consumer electronics, dominate the most recent group of electric vehicle batteries in development.

Rechargeable batteries may be used in the form of a battery module formed of a plurality of unit battery cells coupled in series and/or in parallel so as to provide a high energy density, e.g., for motor driving of a hybrid vehicle. Thus, the battery module may be formed by interconnecting the electrode terminals of the plurality of unit battery cells depending on a designed amount of power and in order to realize a high-power rechargeable battery.

A battery pack may be a set of any number of (e.g., identical) battery modules, which may be configured in a series, in parallel, or as a mixture of both to deliver the intended voltage, capacity, or power density. Components of battery packs may include the individual battery modules and interconnects, which provide electrical conductivity between the battery modules.

For meeting the dynamic power demands of various electrical consumers connected to the battery system, a static control of battery power output and charging may not be sufficient. Thus, steady exchange of information between the battery system and the controllers of the electrical consumers may be used. Such information may include the battery system's actual state of charge (SoC), potential electrical performance, charging ability, and internal resistance, as well as actual or predicted power demands or surpluses of the consumers.

Battery systems may include a battery management system (BMS) and/or battery management unit (BMU) for processing the aforementioned information. The BMS/BMU may communicate to the controllers of the various electrical consumers via a suitable communication bus, e.g., an SPI or CAN interface. The BMS/BMU may further communicate with each of the battery submodules, e.g., with a cell supervision circuit (CSC) of each battery submodule. The CSC may be further connected to a cell connection and sensing unit (CCU) of a battery submodule that interconnects the battery cells of the battery submodule.

Thus, the BMS/BMU may be provided for managing the battery pack, such as by protecting the battery from operating outside its safe operating area, monitoring its state, calculating secondary data, reporting that data, controlling its environment, authenticating, and/or balancing it.

SUMMARY

Embodiments are directed to an electric current measuring arrangement for a battery system, including: a first control unit including a first microcontroller; a second control unit including: a second microcontroller; an amplifier electrically interconnected between the second microcontroller and terminals of a shunt resistor for current measurement; and a node interconnected between one of the terminals of the shunt resistor and the amplifier; a communication line communicatively connecting the first control unit and the second control unit. The first microcontroller may be configured to generate a test pattern signal, and to transmit the test pattern signal to the second control unit through the communication line. The second control unit may be configured to transmit the test pattern signal to the node. The second microcontroller may be configured to receive a measuring signal through the amplifier, the measuring signal being generated based on the test pattern signal that is transmitted to the node. The first microcontroller may be configured to receive the measuring signal through the communication line from the second microcontroller, compare the measuring signal with the test pattern signal, and verify the current measurement based on the comparison.

Embodiments are directed to a battery system, including: the electric current measuring arrangement; and a plurality of battery cells that are interconnected. The shunt resistor may be electrically connected to an output terminal of the plurality of battery cells.

Embodiments are directed to an electric vehicle including the battery system.

Embodiments are directed to a method of measuring an electric current of the battery system, the method including: generating, by the first microcontroller, a test pattern signal; transmitting, by the first microcontroller, the test pattern signal to the second control unit through the communication line; transmitting, by the second microcontroller, the test pattern signal to the node; receiving, by the second microcontroller, a measuring signal, generated in response to the test pattern signal, through the amplifier; receiving, by the first microcontroller, the measuring signal through the communication line from the second microcontroller; and comparing, by the first microcontroller, the measuring signal with the test pattern signal to verify the current measurement.

BRIEF DESCRIPTION OF THE DRAWINGS

Features will become apparent to those of skill in the art by describing in detail example embodiments with reference to the attached drawings in which.

DETAILED DESCRIPTION

Figure 1:
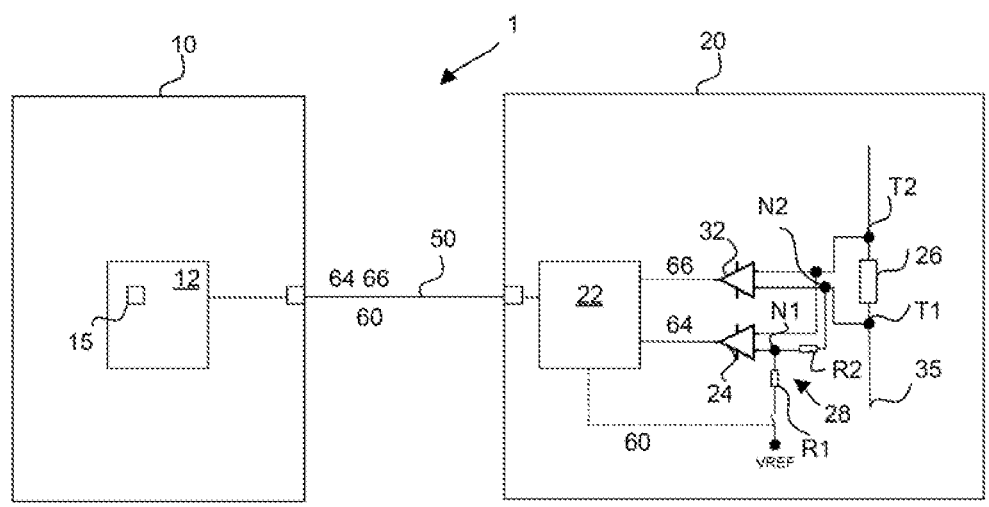
FIG. 1 illustrates an electric current measuring arrangement for a battery system according to a first example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

As used herein, the term "and/or" includes any and all combinations of one or more of the associated listed items.

It will be understood that although the terms "first" and "second" are used to describe various elements, these elements should not be limited by these terms. These terms are only used to distinguish one element from another element. For example, a first element may be named a second element and, similarly, a second element may be named a first element.

Terms of a singular form may include plural forms unless the context clearly indicates otherwise.

It will be further understood that the terms "include," "include," "including," or "including" specify a property, a region, a fixed number, a step, a process, an element, a component, and a combination thereof, but do not exclude other properties, regions, fixed numbers, steps, processes, elements, components, and combinations thereof.

Electronic or electric devices and/or any other relevant devices or components according to embodiments described herein may in some cases be implemented utilizing suitable hardware, firmware (e.g., an application-specific integrated circuit), software, or a combination of software, firmware, and hardware. Various components may be formed on one integrated circuit (IC) chip or on separate IC chips. Further, various components may be implemented on a flexible printed circuit film, a tape carrier package (TCP), a printed circuit board (PCB), or formed on one substrate. Further, various components may be implemented as a process or thread, running on one or more processors, in one or more computing devices, executing computer program instructions and interacting with other system components for performing the various functionalities described herein. The computer program instructions may be stored in a memory, which may be implemented in a computing device using a standard memory device, such as, e.g., a random access memory (RAM). The computer program instructions may also be stored in non-transitory computer readable media such as, for example, a CD-ROM, flash drive, or the like. Also, the functionality of various computing devices may be combined or integrated into a single computing device, or the functionality of a particular computing device may be distributed across one or more other computing devices.

In a general battery system, an electronic battery disconnect unit, generalized as a control unit, may use two measuring channels, including one Hall sensor and one shunt resistor, for current measurement. Due to the two measuring paths, a certain level of safety may be provided.

However, a Hall sensor may be expensive, and magnetic fields, e.g., from adjacent bus bars, may influence the measurement result. Therefore, an expansive shield for magnetic fields may be called for.

In a general HV battery system, three different control components may be used. A battery system manager may include a main control unit in the battery system and may control a relay. An electronic battery disconnect unit (BDUe) may have a function of providing a current measurement. A battery module manager BMM may have a function of cell voltage measurement and cell temperature measurement.

In general, for current measurement, the current may be measured by a shunt sensor and a Hall sensor. For these two sensors, two physical interfaces may be used, e.g., a CAN interface for the shunt sensor and an analog interface for the Hall sensor, to transmit the measuring signals.

In such a system, due to an ASIL level (Automotive Safety Integrity Level, e.g., according to ISO 26262), decomposition of the shunt resistor (ASIL A(C)) and the Hall sensor (ASIL B(C)) may be followed using software on the microcontroller of the BDUe, which may be challenging for the operating system.

The microcontroller of the battery system manager may follow the ASIL level to process the relevant signals in ASIL C or D quality. A processing bottleneck may present a challenge for the microcontroller of the BDUe. Further, when this is identified as an ASIL A path, ASIL A may be implemented on the microcontroller.

In general, it may be desirable to reduce costs, provide ASIL A on the microcontroller of the BDUe, reduce sensitivity to magnetic fields, reduce wiring harness complexity, and the like.

In general, a test pattern or test pattern signal may be used to verify a measurement path, e.g., by additional patterns on the shunt resistor. When two measuring channels go through the microcontroller, the microcontroller may be implemented according to an ASIL level such as ASIL C, which may result in increased costs and development effort.

As described herein, embodiments may provide a measuring arrangement that verifies a current measurement on a shunt resistor with reduced implementation costs and development efforts, while providing a desired safety level. In an example embodiment, the safety level may be an intrinsic technical property of each microcontroller. In an example embodiment, safety level may be defined in terms of failure rate, e.g., a higher safety level may correspond to a lower failure rate per number of operations, whereas a lower safety level may correspond to a higher failure rate per number of operations.

An electric current measuring arrangement for a battery system according to an example embodiment may include a first control unit including a first microcontroller. The arrangement may include a second control unit. The second control unit may include a second microcontroller, an amplifier electrically interconnected between the second microcontroller and terminals of a shunt resistor for current measurement, and a node interconnected between one of the terminals of the shunt resistor and the amplifier. The arrangement may include a communication line communicatively connecting the first control unit and the second control unit. The first microcontroller may be configured to generate a test pattern signal, and to transmit the test pattern signal to the second control unit through the communication line. The second control unit may be configured to transmit the test pattern signal to the node. The second microcontroller may be configured to receive a measuring signal, generated in response to the test pattern signal, through the amplifier. The first microcontroller may be configured to receive the measuring signal through the communication line from the second microcontroller, compare the measuring signal with the test pattern signal, and verify the current measurement based on the comparison.

The first control unit may be a battery system manager. The second control unit may be a battery disconnect unit. The communication line may form a communication path through a physical interface between the first control unit and the second control unit. The interface may be a CAN (controller area network) interface, but embodiments are not restricted thereto and other interfaces may be used. Verifying the current measurement may include detecting the integrity or functionality of the current measurement. Such comparing may be successful when a test pattern is consistent with a measuring signal, e.g., when the measuring signal and test pattern signal have the same pattern. The test pattern signal may also be referred to as a test signal. The test pattern signal may include a sequence of low and high levels. A test pattern may be characteristic, such that a comparison with the measuring signal may verify the current measurement. A comparison may detect and verify one or more failure modes, e.g., when a shunt resistor is missing or incorrectly connected, when an amplifier does not work properly (e.g., no gain or insufficient gain is provided) or is not connected or incorrectly connected, etc. Thus, the measurement path may be checked by the test pattern signal.

In an example embodiment, the second microcontroller may not be used to generate the test pattern signal, and/or may not perform comparison/verification of the measuring signals with the test pattern. For these operations, safety levels may be called for that the second microcontroller associated with the current measurement may not meet. Therefore, the first microcontroller of the first control unit may be used for these operations. Thus, in an example embodiment, the second microcontroller may have a low safety level or no specified safety level. This may reduce costs by allowing the second microcontroller to be used for current measurement with a low safety level or no specified safety level, as in a battery disconnect unit, while a first microcontroller of the battery system manager may have a high safety level or higher safety level. With the first microcontroller, a high safety level (e.g., ASIL C or ASIL-D) may be provided, even when second microcontroller has no specified safety level. Safety-relevant tasks may therefore be outsourced from the second microcontroller and a bottleneck of second microcontroller may be avoided using the first microcontroller. Further, an additional Hall sensor may not be used, magnetic disturbance may not be produced, excessive shielding may be avoided, and fewer, e.g., one less, communication lines may be used.

In an example embodiment, the safety level of the first microcontroller may be higher than the safety level of the second microcontroller. The safety level may be determined according to ASIL or ISO 26262, but embodiments are not restricted thereto. Thus, safety-related tasks, e.g., the generation of the test pattern and the comparison of the test pattern with the measuring signal, may be performed by the first microcontroller, which has the higher safety level. In an example embodiment, the first microcontroller may have safety level ASIL D or ASIL C, and the second microcontroller may not have a safety level according to ASIL.

In an example embodiment, the second control unit may include a hardware encryption unit separately provided from the second microcontroller and configured to generate an encrypted test pattern signal based on the test pattern signal, and to transmit the encrypted test pattern signal to the node. The second microcontroller may be configured to receive the measuring signal, generated in response to the encrypted test pattern signal, through the amplifier. Thereby, a safe end-to-end connection may be implemented due to encryption. In an example embodiment, the second microcontroller may not provide the encryption, since the separate hardware encryption unit independent of the second microcontroller may be used to generate the encrypted test pattern signal.

In an example embodiment, the hardware encryption unit may include shift registers configured to generate the encrypted test pattern signal, which may provide a simple and fast implementation wherein standard gates may be used. The hardware encryption unit may also be referred to as a hardware secure element.

In an example embodiment, the second microcontroller may be configured to generate an encrypted test pattern signal based on the test pattern signal, and to transmit the encrypted test pattern signal to the node. The second microcontroller may be configured to receive the measuring signal, generated in response to the encrypted test pattern signal, through the amplifier. In this example embodiment, as described in additional detail below, the first microcontroller having a higher safety level may be used for checking the test pattern signals, and not the second microcontroller. The encryption in the microcontroller may be done by using an encryption program including instructions which, when executed on the first microcontroller, cause the microcontroller to generate the encrypted test pattern based on the test pattern.

In an example embodiment, the first microcontroller may be configured to generate the encrypted test pattern signal based on the test pattern signal, to receive the measuring signal through the communication line, and to compare the measuring signal with the encrypted test pattern signal. Thereby, a safe end-to-end connection, which may be referred to as a gray channel, may be implemented. The comparison may then be done for the encrypted signals. The second microcontroller may be entirely excluded from the comparison. The encryption in the first microcontroller may be done by using an encryption program, including instructions which, when executed on the microcontroller, cause the microcontroller to generate the encrypted test pattern based on the test pattern. The encryption program may be referred to as an encryption function.

In an example embodiment, the first microcontroller and the second microcontroller (or the first microcontroller and the hardware encryption unit) may be configured to start the generation of the encrypted test pattern signal according to a synchronized clock, to generate identical encrypted test pattern signals. Thus, when the comparison is performed by the first microcontroller, verification of the current measurement may be reliably performed. The encryption may be performed using a general method, e.g., the encryption may be performed by using a pseudo random generator applied to the test pattern signal. A reset functionality may be implemented depending on the architecture and failure rates of the system.

In an example embodiment, the second microcontroller may be configured to receive the test pattern signal, and to transmit the test pattern signal to the node.

In an example embodiment, the second microcontroller may be configured to receive the test pattern signal, and to transmit the test pattern signal to the hardware encryption unit. In these example embodiments, the second microcontroller may function as receiver and transmitter, thus as a communicator, of the test pattern signal.

In an example embodiment, generation of the test pattern signal and comparison may not be performed by the second microcontroller, and, in an example embodiment, these operations may be solely performed by the first microcontroller.

In an example embodiment, the first microcontroller may be configured to transmit the test pattern signal to the node of the second control unit through the communication line by bypassing the second microcontroller, in which case the test pattern signal may not pass through the second microcontroller. Thus, when no safety level is specified or only a low safety level is associated with the second microcontroller, bypassing the microcontroller may further increase safety, since the second microcontroller may not provide these communication functions.

In an example embodiment, the second control unit may include two amplifiers each interconnected between the shunt resistor and the second microcontroller. The second microcontroller may be configured to receive two measuring signals, generated in response to the transmitted test pattern signal, through the amplifiers. The first microcontroller may be configured to receive the measuring signals through the communication line, and to compare the first measuring signal and the second measuring signal with the test pattern signal. The two amplifiers may provide redundancy. A faulty function or defect of one of the amplifiers may be detected.

In an example embodiment, a battery system may include a plurality of interconnected battery cells and an electric current measuring arrangement according to an example embodiment, in which the shunt resistor may be electrically connected to an output terminal of the plurality of battery cells. In an example embodiment, an electric vehicle may include the battery system.

In an example embodiment, a method of measuring electric current of a battery system may include: generating, by the first microcontroller, a test pattern signal; transmitting, by the first microcontroller, the test pattern signal to the second control unit through the communication line; transmitting, by the second microcontroller, the test pattern signal to the node; receiving, by the second microcontroller, a measuring signal, generated in response to the transmitted test pattern signal, through the amplifier; receiving, by the first microcontroller, the measuring signal through the communication line from the second microcontroller; and comparing, by the first microcontroller, the measuring signal with the test pattern signal to verify the current measurement In an example embodiment, the safety level of the first microcontroller may be higher than the safety level of the second microcontroller.

FIG. 1 shows an electric current measuring arrangement 1 for a battery system according to an example embodiment.

Referring to FIG. 1, the arrangement 1 may include a first control unit 10, which may include a first microcontroller 12. The first control unit 10 may be a battery system manager, but embodiments are not restricted thereto.

The arrangement 1 may included a second control unit 20, which may include a second microcontroller 22. In an example embodiment, the second control unit 20 may be a battery disconnect unit.

The first microcontroller 12 may have safety level that is higher than a safety level of the second microcontroller 22. For example, the first microcontroller 12 may have a safety level according to ASIL. A higher safety level may refer to a lower failure rate in time and a lower safety level may refer to a higher failure rate in time per operations. The safety level may be an intrinsic technical property of the microcontrollers 12, 22. The safety level of the first microcontroller 12 may have an ASIL C or ASIL D level. The second microcontroller 22 may not fulfill an ASIL safety level or may have safety level that is lower than the ASIL C or ASIL D level.

The second control unit 20 may include a shunt resistor 26. The shunt resistor 26 may be used for measuring the electric current of a battery system. The shunt resistor 26 may be connected in series with a power line 35 through which an electrical current as output or input to a plurality of battery cells flows. This is described in additional detail in connection with FIG. 5. The voltage signal across the terminals T1, T2 of the shunt resistor 26 may be indicative of the electrical current for a given ohmic resistance.

One or more amplifiers, e.g., amplifiers 24, 32, may be electrically interconnected between the second microcontroller 22 and the corresponding terminals T1, T2 of the shunt resistor 26, e.g., in the case of a low voltage signal on the shunt resistor 26. Input resistors may be provided at each input of the amplifiers 24, 32 (not shown). The amplifiers 24, 32 may amplify the voltage signal across the terminals T1, T2 of the shunt resistor 26 which is indicative of the electrical current. The output signals of the amplifiers 24, 32 may be received by the second microcontroller 22. The amplifiers 24, 32 may have an additional voltage supply (not shown) for providing the gain of the voltage signal.

Nodes N1, N2 may be interconnected between one of the terminals T1, T2 of the shunt resistor 26 and the amplifiers 24, 32. The nodes N1, N2 will be described below in more detail.

In this example embodiment, two amplifiers 24, 32 are provided which are both interconnected between the second microcontroller 22 and a corresponding terminal T1, T2 of the shunt resistor 26. Thereby, redundancy may be provided, which may increase safety. In another example embodiment, only one amplifier, e.g., the amplifier 32, may be used.

The arrangement 1 may include a communication line 50 communicatively connecting the first control unit 10 and the second control unit 20. The communication line 50 may be a communication path for transmitting signals across a physical interface between the first control unit 10 and the second control unit 20. The physical interface between the control units 10, 20 may be, for example, a CAN interface.

In operation, the first microcontroller 12 may be configured to generate a test pattern signal 60. The test pattern signal 60 may be, for example, a characteristic sequence of low and high signal levels in a particular order. The test pattern signal 60 may be transmitted by the first microcontroller 12 to the second control unit 20 through the communication line 50. Since the first microcontroller 12 may have a safety level, e.g., ASIL C or D, the generation of the test pattern signal by the first microcontroller 12 may be a safe process. A storage may be provided in which the test pattern signal 60 is stored.

The second control unit 20 may be configured to transmit the test pattern signal 60 received via the communication line 50 to the nodes N1, N2.

In the present example embodiment, the second microcontroller 22 is configured to receive the test pattern signal 60. The second microcontroller 22 then, in response, transmits the test pattern signal 60 to the nodes N1, N2. Thus, the second microcontroller 22 acts as a communicator for the test pattern signal 60.

The transmission of the test pattern signal 60 to the nodes N1, N2 may be performed using, e.g., a test pattern circuit 28. This example implementation is also used as example in the further embodiments of FIGS. 2 to 4 and its explanation will not be repeated there. The present example embodiment is not restricted to an analog test pattern circuit 28 to transmit the test pattern signal 60 to the nodes N1, N2, but an analog circuit may be simple and readily implemented.

In an example embodiment, the test pattern signal 60 may be used as a control signal to output a switched voltage signal (e.g., from the voltage source VREF) according to the test pattern signal 60. The switched voltage signal may be consistent with the test pattern signal 60 and may be referred to as the test pattern signal 60 itself due to a mere amplitude change. The voltage VREF may be predetermined to impose a measurable offset on the nodes N1, N2.

The test pattern signal 60, also referred to as the switched voltage signal, may be applied to the nodes N1, N2 via first and second resistors R1 and R2. In an example embodiment, the second resistor R2 may be omitted. The test pattern signal 60 may cause a voltage change on the nodes N1, N2 and thereby a measurable offset on the inputs of the amplifiers 24, 32 in accordance with the test pattern signal 60. Thus, the sequence of the test pattern signal 60 may be measurable.

The amplifiers 24, 32 may output respective measuring signals 64, 66 in response to the test pattern signal 60 (the switched voltage signal). The measuring signals 64, 66 may be amplified signals according to a gain of the amplifiers 24, 32.

The second microcontroller 22 may be configured to receive the measuring signals 64, 66, which are generated in response to the test pattern signal 60, through the amplifiers 24, 32.

The second microcontroller 22 may be configured transmit the measuring signals 64, 66 to the first microcontroller 12 through the communication line 50. The first microcontroller 12 may be configured to receive the measuring signals 64, 66 through the communication line 50 from the second microcontroller 22.

The first microcontroller 12 may be configured to compare the measuring signals 64, 66 with the test pattern signal 60. Since the first microcontroller 12 may have a safety level such as C or D according to ASIL, the comparison of the test pattern signal by the first microcontroller 12 may be a safe process. The comparison may be performed by a comparison function 15 of the first microcontroller 12. The comparison function 15 may implemented by, e.g., a computer program including instructions that cause the first microcontroller 12 to perform the comparison and verification.

Based on the comparison, a current measurement may be verified. Thus, the integrity or functionality of the current measurement may be tested or checked. For example, a current measurement may be performed with a successive test. When the comparison is successful, the previous current measurement may thus be verified. Thus, the functionality of the current measurement may be determined.

Such comparing may be successful when the generated test pattern is consistent or equal with the measuring signal. This may be the case when the measuring signal and test pattern signal have the same pattern. The test pattern signal may also be referred to as a test signal. The comparison may detect and verify several failure modes, e.g., when the shunt resistor 26 is missing or incorrectly connected, when there is a short circuit to ground, when one of the amplifiers 24, 32 does not work properly (e.g., no gain or insufficient gain is provided), or when one of the amplifiers 24, 32 is not connected or is incorrectly connected. The integrity of the measurement path may be checked by comparison of the signals.

In an example embodiment, the second microcontroller 22 does not perform the generation of the test pattern signal 60, and does not perform the comparison of the measuring signals 64, 66 with the test pattern signal 60. Instead, for these functions, the first microcontroller 12 of the first control unit 10 may be used. Thus, in the present example embodiment, the second microcontroller 22 may have a low safety level, or a lower safety level than the first microcontroller 12, and thus a more cost-efficient second microcontroller 22 may be used, while the high, or higher, safety level of the external first microcontroller 12 may be used. Such realization may be cost efficient because the second microcontroller 22 may have a low, or lower, or even no specified safety level, and a microcontroller of, e.g., a battery system manager, with higher safety level, may be used for fulfilling the safety-relevant tasks of generating the test pattern signal and providing the comparisons of the signals. Safety-relevant tasks of generating the test pattern and providing the comparison may be outsourced from the second microcontroller 22 and therefore a bottleneck of the second microcontroller 22 may be avoided by usage of the safety level of the first microcontroller 12 to provide a current measurement with high, e.g., ASIL C, safety level.

In the present example embodiment, the second control unit 20 may include two amplifiers 24, 32 interconnected between the shunt resistor 26 and the second microcontroller 22. The second microcontroller 22 may be configured to receive two measuring signals 64, 66, generated in response to the test pattern signal 60, through the amplifiers 24, 32. The first microcontroller 12 may be configured to receive the measuring signals 64, 66 through the communication line 50, and to compare the first measuring signal 64 and the second measuring signal 66 with the test pattern signal 60. Thus, multiple measurement paths may be verified. The two amplifiers 24, 32 may provide further safety in the testing due to redundancy. The use of the second resistor R2 may provide an advantage in that the measuring signals 64, 66 may be distinguishable by the first microcontroller 12 due to different amplitudes.

Figure 2:
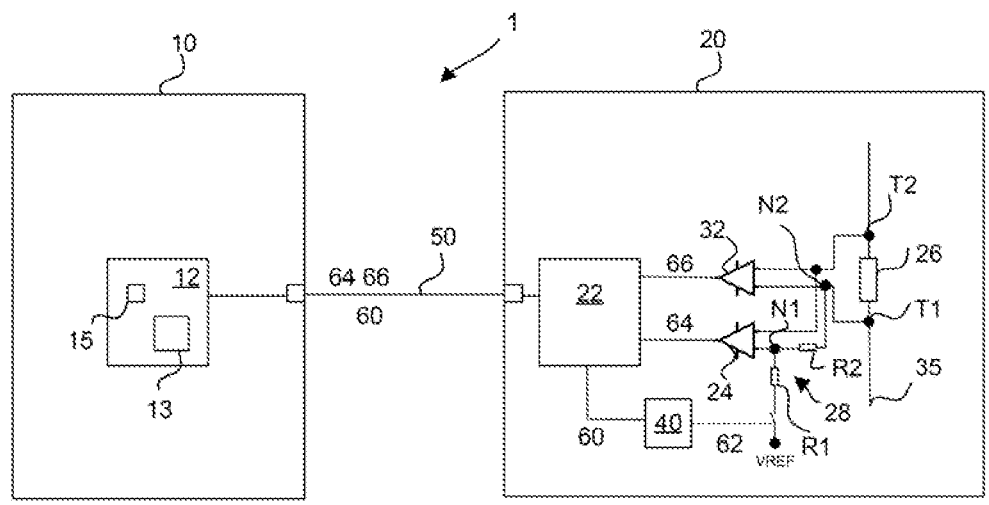
FIG. 2 illustrates an electric current measuring arrangement for a battery system according to a second example embodiment.

FIG. 2 shows the electric current measuring arrangement 1 for a battery system according to another example embodiment. In the following, only the differences with respect to the embodiment of FIG. 1 are described in detail.

According to the present example embodiment, the second control unit 20 may include a hardware encryption unit 40. The hardware encryption unit 40 may be separately provided from the second microcontroller 22.

The hardware encryption unit 40 may be configured to generate an encrypted test pattern signal 62 based on the test pattern signal 60, which is generated by and received from the first microcontroller 12 via the communication line 50. In the present example embodiment, the second microcontroller 22 may be configured to receive the test pattern signal 60 and transmit the test pattern signal 60 to the hardware encryption unit 40. In another example embodiment, the test pattern signal 60 may be transmitted to the hardware encryption unit 40 directly from the communication line 50 bypassing the second microcontroller 22, similar to the embodiment of FIG. 4 described below.

The hardware encryption unit 40 may include shift registers configured to generate the encrypted test pattern signal 62. The shift registers may be fast in, e.g., generating pseudo random numbers, and may provide rapid encryption.

The hardware encryption unit 40 may be configured to transmit the encrypted test pattern signal 62 to the nodes N1, N2. The transmission may be performed according to the test pattern circuit 28 as described in the context of FIG. 1, but embodiments are not restricted thereto. The switched voltage source VREF may be switched according to the encrypted test pattern signal 62. The second microcontroller 22 may be configured to receive the measuring signals 64, 66, generated in response to the encrypted test pattern signal 62, through the amplifiers 24, 32. The measuring signals 64, 66 may be received by the first microcontroller 12 through the communication line 50.

In an example embodiment, the first microcontroller 12 may also be configured to generate the encrypted test pattern signal 62 based on the test pattern signal 60. The first microcontroller 12 may therefore include an encryption function 13 as indicated in FIG. 2. The encryption in the first microcontroller 12 may be done by using an encryption computer program, including instructions which, when executed on the first microcontroller 12, cause the first microcontroller 12 to generate the encrypted test pattern based on the generated test pattern.

The first microcontroller 12 may be configured to compare the measuring signals 64, 66 with the encrypted test pattern signal 62. This comparison and verification may be performed in the same manner as described in the context of FIG. 1.

In an example embodiment, the first microcontroller 12 and the hardware encryption unit 40 may both be configured to start the generation of the encrypted test pattern signal 62 according to a synchronized clock, to thus generate identical encrypted test patterns. A pseudo random number generator may be used for encryption. Also, a reset functionality may be implemented. This example embodiment may provide a safe end-to-end connection due to the encryption process. Therefore, the use of the first microcontroller 12 may be safely provided due to an implemented gray channel. The safe end-to-end connection may be established without using the second microcontroller 22. Therefore, in this example embodiment, a low or lower safety level of the second microcontroller 22 can be used without loss of safety, even when encryption is done.

Figure 3:
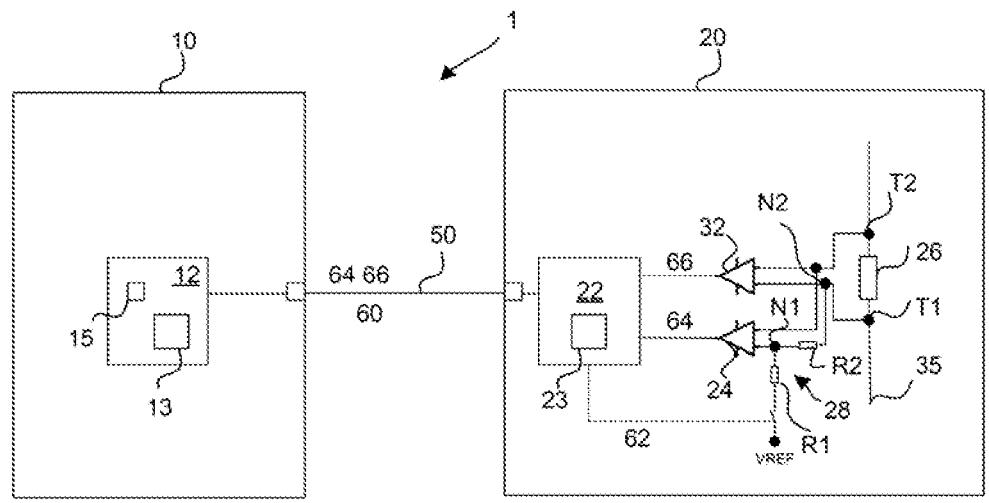
FIG. 3 illustrates an electric current measuring arrangement for a battery system according to a third example embodiment.

FIG. 3 shows the electric current measuring arrangement 1 for a battery system according to another example embodiment. In the following, only the differences with respect to FIG. 2 are mainly described, and for the remaining features refer to FIG. 1 and FIG. 2 and the description thereof.

Referring to FIG. 3, in the present example embodiment, as compared with FIG. 2, the second microcontroller 22 itself is configured to generate the encrypted test pattern signal 62 based on the test pattern signal 60 received via the communication line 50 from the first microcontroller 12.

The second microcontroller 22 may thus include an encryption function 23 as indicated in FIG. 3. The encryption by the second microcontroller 22 may be done by using an encryption program, including instructions which, when executed on the second microcontroller 22, cause the second microcontroller 22 to generate the encrypted test pattern based on the test pattern 60. Thus, encryption may be done by the second microcontroller 22, while the comparison/ check or verification of the signals may still be performed with a high, or higher, safety level using the first microcontroller 12. In the present example embodiment, the first microcontroller 12 may have a higher safety level (relative to the second microcontroller 22) and may perform the operations of generating the test pattern 60, and comparing.

The second microcontroller 22 may be configured to transmit the encrypted test pattern signal 62 to the nodes N1, N2, and an additional hardware encryption unit may not be used according to the present example embodiment.

Summarizing the example embodiment of FIG. 2, the second microcontroller 22 may be configured to receive the measuring signals 64, 66, generated in response to the encrypted test pattern signal 62, through the amplifiers 24, 32, and the first microcontroller 12 may be configured to generate the encrypted test pattern signal based on the test pattern signal 60 such that the first microcontroller 12 may include the encryption function 13 as indicated in FIG. 2. The measuring signals 64, 66 may be received through the communication line 50. The first microcontroller 12 may be configured to compare the measuring signal 64, 66 with the generated encrypted test pattern signal 62.

On the other hand, referring to FIG. 3, the first microcontroller 12 and the second microcontroller 22 may be configured to start the generation of the encrypted test pattern signal 62 according to a synchronized clock. Pseudo random number generators may be used for encryption to provide identical encrypted signals. The present embodiment may use the second microcontroller 22 as an encryption unit, whereas the tasks of generating the test pattern signal 60 and the comparing and verification may be performed by the first microcontroller 12, which may have a high safety level or higher safety level.

Figure 4:
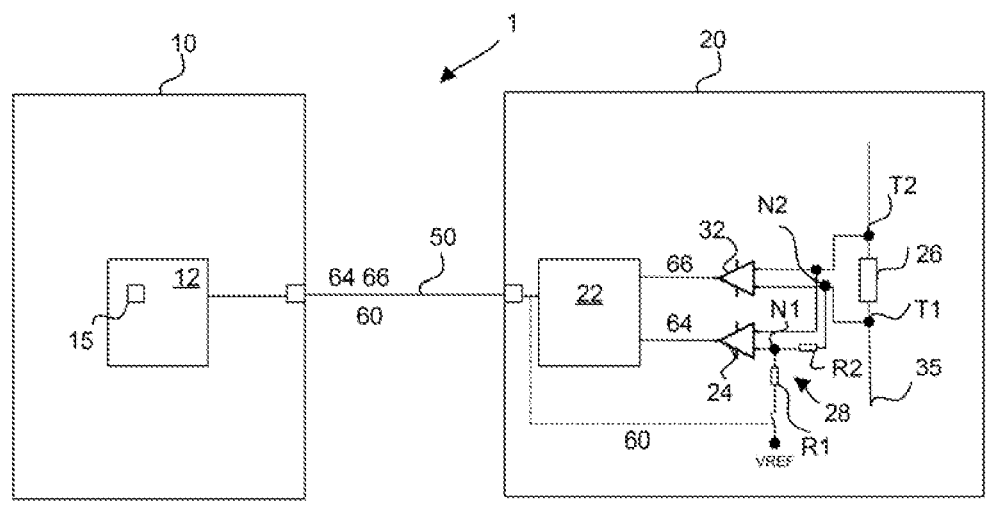
FIG. 4 illustrates an electric current measuring arrangement for a battery system according to a fourth example embodiment.

FIG. 4 shows the electric current measuring arrangement 1 for a battery system according to another example embodiment. In the following, only the differences with respect to FIG. 1 are mainly described, and for further features refer to the description of FIG. 1.

Referring to FIG. 4, in the present example embodiment, the first microcontroller 12 may be configured to transmit the test pattern signal 60 to the nodes N1, N2 of the second control unit 20 via the communication line 50, while bypassing the second microcontroller 22. Therefore, the second microcontroller 22 is not used as communicator (i.e., may not receive the test pattern signal 60 and transmit the test pattern signal 60 to the nodes N1, N2). Thus, a further safety-relevant operational task for the relatively lower safety level second microcontroller 22 may be outsourced from the second microcontroller 22, since the test pattern signal 60 is not going through the second microcontroller 22.

Figure 5:
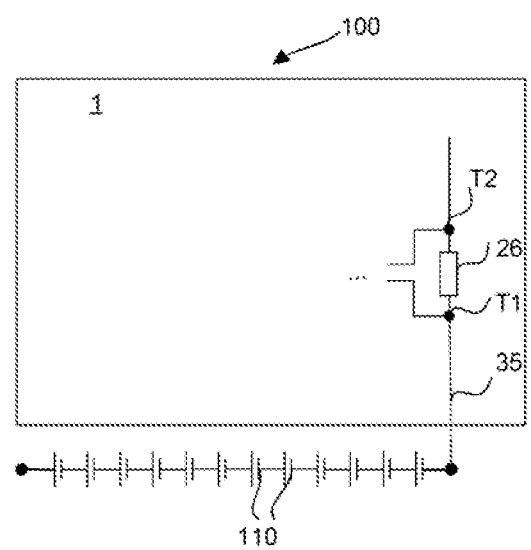
FIG. 5 illustrates a battery system according to an example embodiment.

FIG. 5 shows a battery system 100 according to an example embodiment. The battery system 100 may include the electric current measuring arrangement 1 according to an embodiment. The battery system 100 may include a plurality of interconnected battery cells 110. The shunt resistor 26 is shown in accordance with FIGS. 1 to 4, and is electrically connected to an output terminal of the plurality of battery cells 110.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

REFERENCE SIGNS 1 electric current measuring arrangement
10 first control unit
12 first microcontroller
13 encryption function
15 comparing function
20 second control unit
22 second microcontroller
23 encryption function
24 amplifier
26 shunt resistor
28 test pattern circuit
32 amplifier
40 hardware encryption unit
50 communication line
60 test pattern signal
62 encrypted test pattern signal
64 measuring signal
66 measuring signal
N1 node
N2 node
R1 resistor
R2 resistor
T1 terminal
T2 terminal
100 battery system
110 battery cell

What is claimed is:

1. An electric current measuring arrangement for a battery system, comprising:
    a first control unit including a first microcontroller;
    a second control unit including:
        a second microcontroller;
        an amplifier electrically interconnected between the second microcontroller and terminals of a shunt resistor for current measurement; and
        a node interconnected between one of the terminals of the shunt resistor and the amplifier;
    a communication line communicatively connecting the first control unit and the second control unit, wherein:
    the first microcontroller is configured to generate a test pattern signal, and to transmit the test pattern signal to the second control unit through the communication line,
    the second control unit is configured to transmit the test pattern signal to the node,
    the second microcontroller is configured to receive a measuring signal through the amplifier, the measuring signal being generated based on the test pattern signal that is transmitted to the node, and
    the first microcontroller is configured to receive the measuring signal through the communication line from the second microcontroller, compare the measuring signal with the test pattern signal, and verify the current measurement based on the comparison.

2. The arrangement as claimed in claim 1, wherein a safety level of the first microcontroller is higher than a safety level of the second microcontroller.

3. The arrangement as claimed in claim 1, wherein:
    the second control unit includes a hardware encryption unit separately provided from the second microcontroller,
    the hardware encryption unit is configured to generate an encrypted test pattern signal based on the test pattern signal, and to transmit the encrypted test pattern signal to the node, and
    the second microcontroller is configured to receive the measuring signal, generated in response to the encrypted test pattern signal, through the amplifier.

4. The arrangement as claimed in claim 3, wherein the hardware encryption unit includes shift registers configured to generate the encrypted test pattern signal.

5. The arrangement as claimed in claim 3, wherein the second microcontroller is configured to receive the test pattern signal and transmit the test pattern signal to the hardware encryption unit.

6. The arrangement as claimed in claim 1, wherein:
    the second microcontroller is configured to generate an encrypted test pattern signal based on the test pattern signal, and to transmit the encrypted test pattern signal to the node, and
    the second microcontroller is configured to receive the measuring signal, generated in response to the encrypted test pattern signal, through the amplifier.

7. The arrangement as claimed in claim 1, wherein the first microcontroller is configured to generate an encrypted test pattern signal based on the test pattern signal, receive the measuring signal through the communication line, and compare the measuring signal with the encrypted test pattern signal.

8. The arrangement as claimed in claim 7, wherein:
    the second control unit includes a hardware encryption unit separately provided from the second microcontroller, and
    the first microcontroller, and the second microcontroller or the hardware encryption unit, are both configured to start generating the encrypted test pattern signal according to a synchronized clock.

9. The arrangement as claimed in claim 1, wherein the second microcontroller is configured to receive the test pattern signal and transmit the test pattern signal to the node.

10. The arrangement as claimed in claim 1, wherein the first microcontroller is configured to transmit the test pattern signal to the node of the second control unit through the communication line bypassing the second microcontroller.

11. The arrangement as claimed in claim 1, wherein:
    the second control unit includes two amplifiers interconnected between the shunt resistor and the second microcontroller,
    the second microcontroller is configured to receive a first measuring signal and a second measuring signal, each generated in response to the test pattern signal, through respective ones of the two amplifiers, and the first microcontroller is configured to receive the first measuring signal and the second measuring signal through the communication line, and to compare the first measuring signal and the second measuring signal with the test pattern signal.

12. A battery system, comprising:

the electric current measuring arrangement as claimed in claim 1; and a plurality of battery cells that are interconnected, wherein the shunt resistor is electrically connected to an output terminal of the plurality of battery cells.

13. An electric vehicle comprising the battery system as claimed in claim 12.

* * * * *